United States Patent
Altmann

[11] Patent Number: 5,844,436
[45] Date of Patent: Dec. 1, 1998

[54] METHOD OF RECOVERING A SAMPLING CLOCK IN A FRAMED DATA COMMUNICATIONS FORMAT WITH REDUCED PHASE JITTER AND WANDER

[75] Inventor: Michael Altmann, Sacramento, Calif.

[73] Assignee: Northern Telecom Ltd., Montreal, Canada

[21] Appl. No.: 743,898

[22] Filed: Nov. 6, 1996

[51] Int. Cl.[6] .................................................... H03D 3/24
[52] U.S. Cl. ........................ 327/156; 327/145; 327/165; 375/376
[58] Field of Search ............................ 327/141, 144–153, 327/156–161, 165; 331/10, 11, 12; 375/355, 375, 376

[56] References Cited

U.S. PATENT DOCUMENTS 5,077,529  12/1991  Ghoshal et al. ......................... 327/147
5,574,756  11/1996  Jeong ...................................... 327/147

*Primary Examiner*—Timothy P. Callahan
*Assistant Examiner*—T. T. Lam
*Attorney, Agent, or Firm*—Foley & Lardner

[57] ABSTRACT

To reduce drift in a sampling clock for framed data, a phase detector senses the time difference between (i) the time when a reference mark for the framed data is received and (ii) the time when the nominal number of oversampling clock cycles between reference timing marks is received. This difference is output to a clock controller which chooses a phase change rate based thereon. This phase change rate is applied to an oversampling clock to continuously, progressively, change the phase of the oversampling clock in a sense which tends to reduce this phase error. The phase changing clock is divided down by a frequency divider to generate a sampling clock. The phase of the oversampling clock is changed by generating multiple, equally spaced, phases of the oversampling clock and progressively changing the selection of the active phase.

18 Claims, 3 Drawing Sheets

METHOD OF RECOVERING A SAMPLING CLOCK IN A FRAMED DATA COMMUNICATIONS FORMAT WITH REDUCED PHASE JITTER AND WANDER

FIELD OF THE INVENTION

The present invention relates to a method and apparatus for sampling framed data in order to recover a data stream therefrom.

BACKGROUND OF THE INVENTION

In a framed data communications system, the framed data is sent with periodic reference timing marks. For example, one timing mark may be sent at the beginning of each data frame. A digital phase locked loop using variable-modulus prescalers and a local crystal-stabilized clock has been used in the past to generate a sampling clock for framed data. The local sampling clock is typically synchronized to a reference timing mark whenever a reference timing mark is received. However, some systems have long frame periods so that small differences in the clock rate of the sampling clock as compared with the clock of the transmitting system which generates the framed data can lead to significant sampling phase drift.

This invention seeks to provide a method and apparatus for minimizing sampling drift.

SUMMARY OF THE INVENTION

In accordance with the present invention, there is provided a method of sampling framed data in order to recover a data stream therefrom, where periodic data frames have a reference timing mark, comprising the steps of: generating a clock having a nominal frequency which is an integer multiple of a data rate of said framed data and an integer multiple of a reference timing mark rate, said clock having a phase; detecting cycles of said clock; detecting reference timing marks; sensing any difference between a time when a reference timing mark is detected and a time when a pre-set number of cycles of said clock is detected; changing the phase of said clock based, at least in part, on said difference sensing to produce a phase changing clock; and sampling based on said phase changing clock.

In accordance with another aspect of the invention, there is provided apparatus for sampling framed data in order to recover a data stream therefrom, where periodic data frames have a reference timing mark, comprising: a selectable phase clock generator for generating a clock having a nominal frequency which is an integer multiple of a data rate of said framed data and an integer multiple of a reference timing mark rate, said clock for outputting a selected phase of said clock, said selected phase of said clock for use in sampling framed data; a local timer responsive to output from said selectable phase clock generator for detecting cycles of said clock and for generating a local timing mark whenever a pre-set number of clock cycles are detected; a phase detector for responding to a source of framed data to detect each said reference timing mark of said framed data and responsive to local timing marks output from said local timer, said phase detector for outputting a signal indicating any difference between a time when a reference timing mark is detected and a time when a local timing mark is received from said local timer; a clock controller responsive to output from said phase detector for controlling said selectable phase clock generator to select a phase of said clock.

BRIEF DESCRIPTION OF THE DRAWINGS

In the drawings which illustrate example embodiments of the invention.

DETAIL DESCRIPTION OF THE PREFERRED EMBODIMENTS

Figure 1:
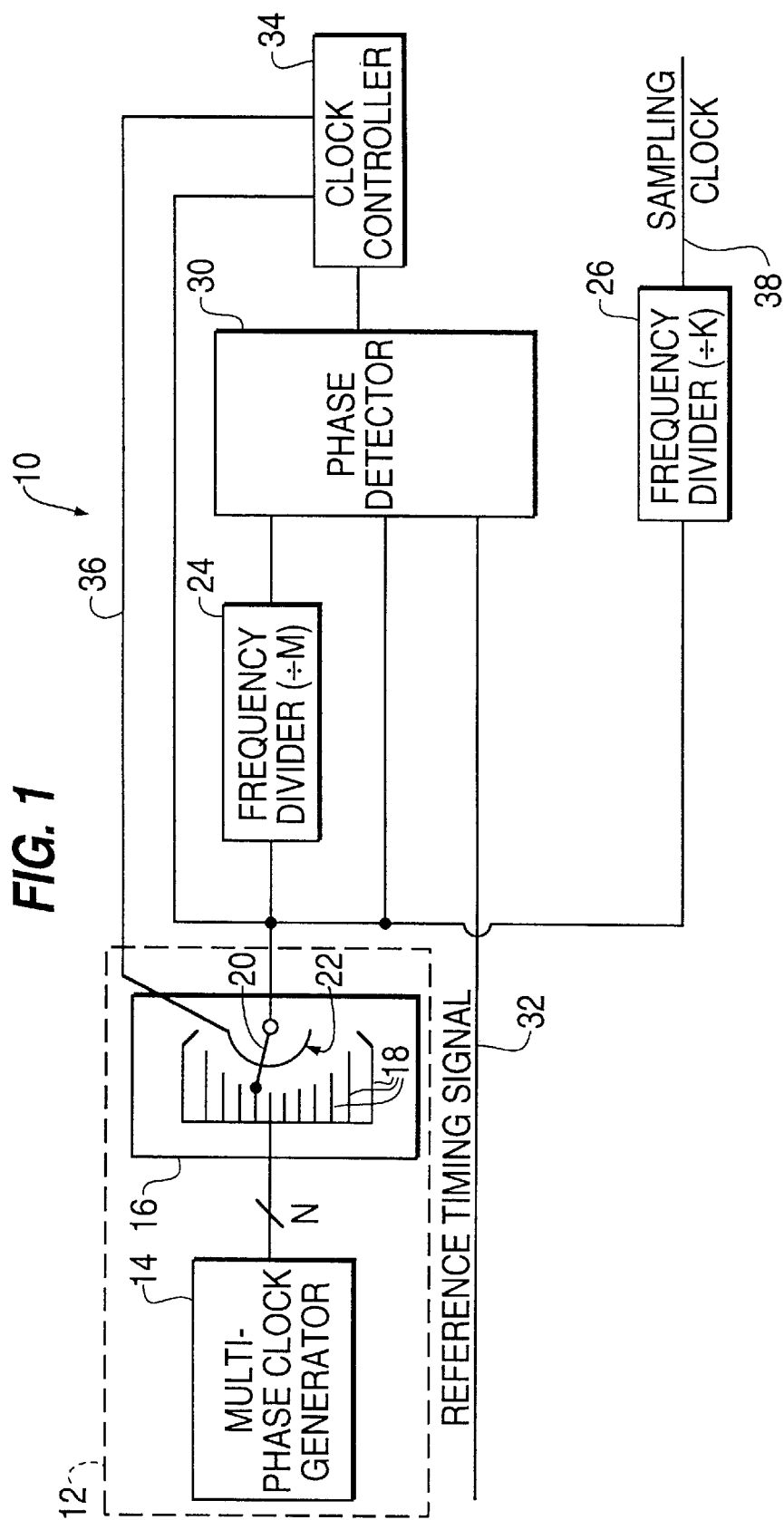
FIG. 1 is a schematic view of apparatus made in accordance with this invention.

Turning to FIG. 1, apparatus for sampling framed data in order to recover a data stream therefrom is illustrated generally at 10. Apparatus 10 has a selectable phase clock 12 comprising a multi-phase clock generator 14 which inputs a phase selector 16. The phase selector 16 comprises phase leads 18, a wiper 20, and a wiper position control 22. A first frequency divider 24, a second frequency divider 26, a phase detector 30, and a clock controller 34 are connected to the clock output. The first frequency divider 24 and a reference timing signal line 32 also input the phase detector 30. The phase detector outputs to clock controller 34 and the clock controller outputs on control line 36 to a control input of wiper position control 22. The second frequency divider 26 outputs to sampling clock line 38.

The multi-phase clock generator 14 may be implemented by means of a multi-stage ring oscillator within a phase locked loop. The phase selector 16 is illustrated schematically; in a preferred embodiment it would be implemented as an integrated circuit, the details of which would be understood by those skilled in the art. The multi-phase clock generator generates N phases of a clock with a nominal frequency which is an integer multiple, "M", of the reference timing mark rate of the framed data signal which apparatus 10 is designed to sample. This nominal frequency is also an integer multiple, "K", of the signal data rate, the data rate being a baud rate, where each baud may comprise a binary bit or a multi-level PCM pulse. These N phases are equally spaced over one clock cycle; in other words, the N phase increments span 360 degrees and are each offset from an adjacent increment by a set number of degrees. One phase appears on each of the phase leads 18. Wiper 20 is selectably connected to one of phase leads 18 by wiper position control 22. The selected phase enters frequency divider 24 which detects each clock cycle (pulse) and, when a pre-set number of cycles are detected, outputs a local timing mark to phase detector 30. The pre-set number of cycles comprise the number, M, which, were the clock 12 perfectly synchronised to the framed data signal, would be the number of clock cycles between reference timing marks. Thus, frequency divider 24 divides by M.

Phase detector 30, in addition to receiving local timing marks from frequency divider 24, detects each reference timing mark on line 32. The phase detector senses the time difference between the time it receives a local timing mark from frequency divider 24 and the time it receives a reference timing mark on line 32. This difference is measured between the frequency divider local timing mark and the reference timing mark which, whether received before or after the local timing mark, is most proximal in time to the local timing mark. The manner in which the phase detector senses this difference is by beginning to count clock pulses from clock 12 when the first of the reference timing mark and frequency divider local timing mark is received and ceasing to count when the other of the reference timing mark and frequency divider local timing mark is received. This counted number of clock pulses is passed to the clock controller. Thus, if, when the clock 12 is perfectly synchronised with the framed data signal, there are M clock cycles between reference timing marks, then the number passed to the clock controller is the difference between the number of clock pulses that actually occurred between reference timing marks and the number (M) that should have occurred. This is a measure of the phase error for the clock and so the number output by the phase detector may be referred to as a phase error number.

Figure 2:
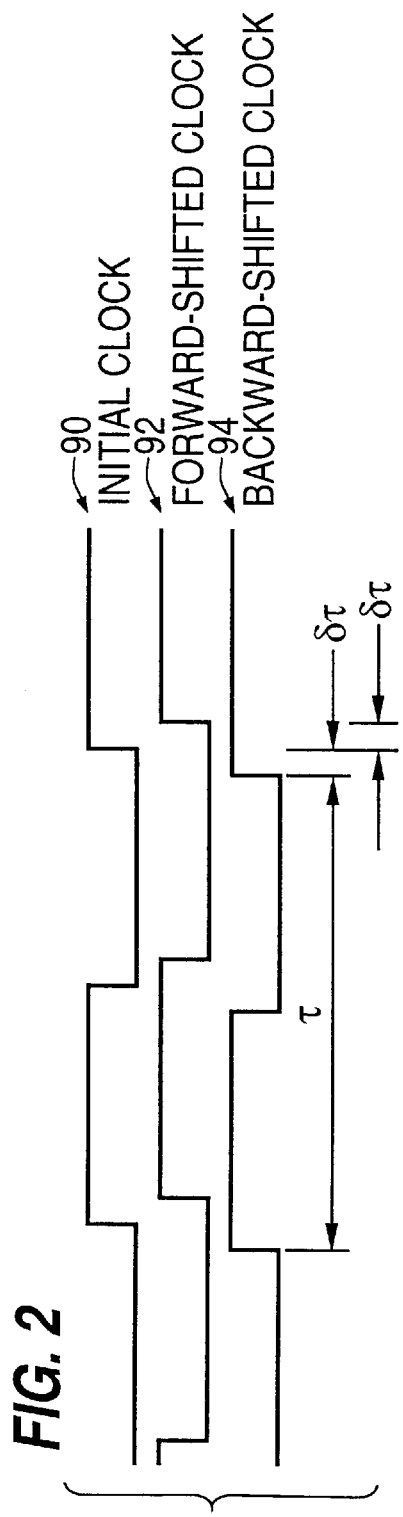
FIG. 2 illustrates phase changed clocks.

Based on the phase error number received from the phase detector, the clock controller selects a phase change rate for the clock 12. More particularly, the controller detects clock cycles and, after detecting a chosen number of cycles, sends a phase change signal on line 36 to cause wiper position controller 22 to reposition the wiper to an adjacent phase lead 18 thereby "updating" the phase of the clock 12. This is repeated after the chosen number of clock cycles is again detected. The sense of incremental rotation of wiper 20 is chosen so as to reduce the phase error. FIG. 2 illustrates, at 90, a timing line for the clock 12 (of FIG. 1). If the clock controller moves wiper 20 (of FIG. 1) from one phase lead 18 (of FIG. 1) to the next, the phase changes by one increment. If this phase change increment shift's the clock forward, then the clock will appear as at timing line 92, and if the phase increment is a backward shift, then the clock will appear as shown at timing line 94. It will be apparent that by changing the phase of the clock at regular intervals (at a phase change rate), the frequency of the clock is altered.

Once the phase detector 30 receives a new local timing mark from frequency divider 24 and a new reference timing mark, it will generate a new phase error number which it passes to the clock controller. Based on this new input, the clock controller will select a new phase change rate for the clock 12 which it will implement as before.

The updated phase clock 12 inputs frequency divider 26 which divides it down by "K" to the data rate of the framed data so as to provide a sampling clock on line 38.

Figure 3:
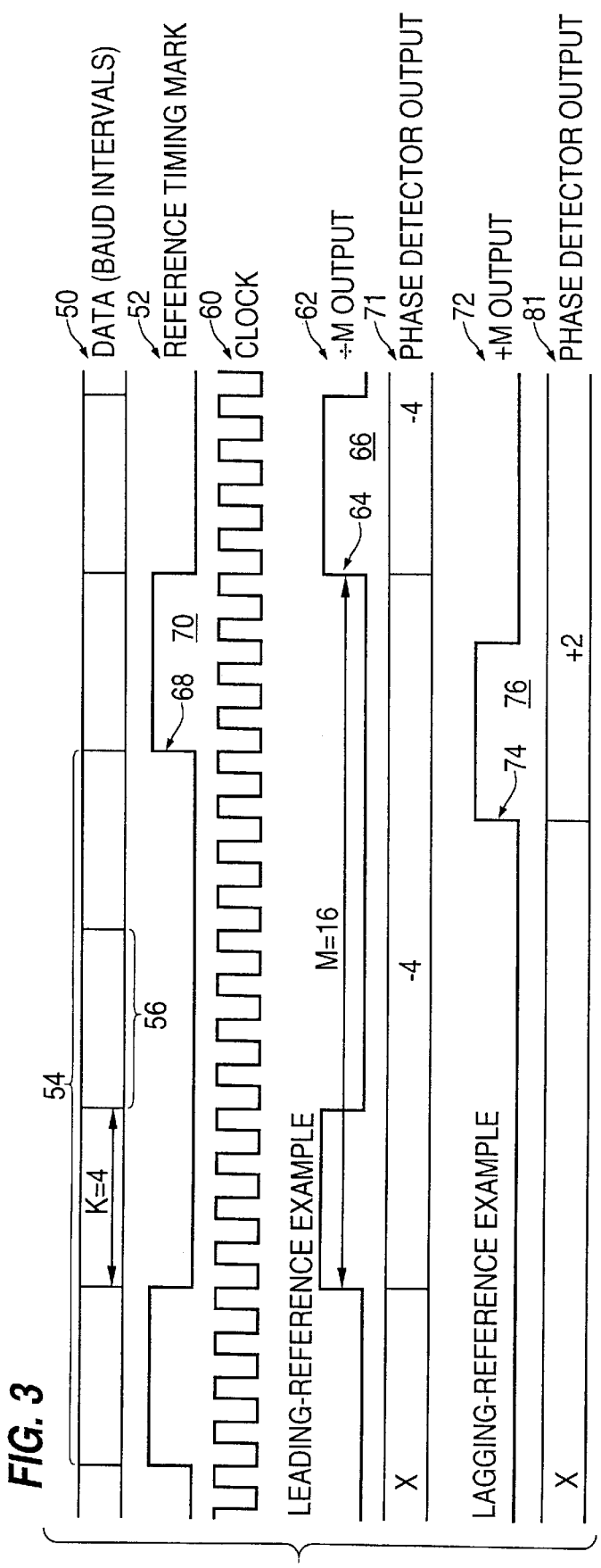
FIG. 3 is an exemplary timing diagram for the apparatus of FIG. 1.

Turning to FIG. 3, which illustrates example timing diagrams for apparatus 10 of FIG. 1, the frames 54 of data carried on signal line 32 (FIG. 1) are illustrated at time line 50 and the periodic reference timing marks 70 carried on signal line 32 (FIG. 1) are illustrated at time line 52. Each baud of data is illustrated at 56. Thus, it will be seen that there are four baud per frame; this is, of course, a much smaller baud rate than would normally be the case. The clock cycles generated by the multi-phase clock generator 14 (FIG. 1) are illustrated at time line 60. In both examples of FIG. 3, sixteen clock cycles are expected between reference timing marks if the clock 12 is synchronised with the frame data signal; therefore, M=16. Further, the expected clock cycles per baud, K, is four.

In a first example, the output from frequency divider 24 is illustrated at time line 62; the frequency divider provides a local timing mark (pulse) 66 at its output each time it counts sixteen cycles of the clock. This frequency divider pulse and each reference timing mark input the phase detector. The phase detector detects the difference, in number of clock cycles, between the time when it senses the leading edge of a reference timing mark and when it senses a leading edge of a pulse from frequency divider 24. For example, the phase detector will sense the leading edge 68 of a reference timing mark on line 32 and then, subsequently, the leading edge 64 of a pulse 66 from frequency divider 24. The phase detector, being also input with the output of the clock generator, counts four clock pulses between the time it detects the leading edge 68 and the time it senses leading edge 64. Since the clock is lagging the reference timing mark by these four clock pulses, the phase detector outputs the phase error number −4 to the clock controller so that the clock controller will choose a phase change in the sense which will attempt to increase the frequency of the clock. From the phase detector output illustrated at 71, it is noted that this output from the phase detector remains at −4 at least until the next time a difference is sensed between a reference timing mark and a local timing mark from frequency divider 24.

In a second example, the output from frequency divider 24 is as shown at time line 72. In this instance, the phase detector will sense the leading edge 74 of pulse 76 from the frequency divider before it senses the leading edge 68 of reference timing mark 70. The phase detector will count two clock pulses between these events. In this instance, the clock is leading and so the phase error number passed to the clock controller is +2 so that the clock controller will change the phase of the clock in a sense which will attempt to decrease the frequency of the clock. The phase detector output in this example is illustrated at 81.

The second frequency divider 26 (of FIG. 1) will divide down by K in order to produce a sampling clock which samples the data stream once per baud.

The system, as described, provides two levels of clock control: (1) continuously changing the phase at a certain phase change rate, and (2) once, each time a reference timing mark is received, adjusting the phase change rate.

If we define the following terms:

τ=nominal clock period

δτ=correction increment

N=number of clock phases

Q=Phase change rate (number of clock cycles/phase update)

f=corrected clock frequency $f_o$=Nominal clock frequency (1/τ) then $$\frac{\tau}{\delta_\tau} = N \tag{1}$$

And also, the corrected clock frequency is given by the following equation:

$$f = f_o \cdot \left(1 + \frac{1}{N \cdot Q}\right) \tag{2}$$

The drawback to this method of control is the nonlinear gain with respect to the control parameter (Q). The effective linearized oscillator gain is:

$$k_v = \frac{\partial f}{\partial Q} = \frac{-f_o}{N \cdot Q^2} \tag{3}$$

where $k_v$=Control gain of oscillator

Q<0→Backward phase shifts only

Q>0→Forward phase shifts only

A unique nonlinearity also occurs when Q equals zero.

To implement this control scheme, it is, therefore, best to provide a look-up table for the control value of Q in the clock controller. This look-up table will have the following form:

TABLE 1

Frequency vs. control

| frequency | control value (Q) in order of increasing frequency (f) |
|---|---|
| $f \ll f_o$ | Q small and negative |
| $f < f_o$ | Q large and negative |
| $f = f_o$ | no shifts (Q = 0 may be used) |
| $f > f_o$ | Q large and positive |
| $f \gg f_o$ | Q small and positive |

The actual values chosen for the look-up table will be dependent on a number of factors, such as desired system responsiveness. In this regard, if the multi-phase clock is generated from a crystal-based source, then it would be expected the frequency inaccuracy of the clock should be on the order of less than 1,000 cycles per million cycles. But, from equation (2), it will be apparent that the minimum incremental frequency correction apparatus 10 is capable of is governed by the product (N.Q). Thus, with a frequency inaccuracy of less than 1,000 per million, it will be apparent that the product N.Q in equation (2) will need to be greater than 1,000. For example, if the number of phases, N, is eight and the maximum Q is 65,535 (i.e. Q is generated from 16 bit counter), a minimum frequency correction of two cycles per million cycles is possible. With the foregoing in mind, it is believed that one skilled in the art could provide suitable values for the look-up table.

It will be apparent to one skilled in the art that the system described is designed to compensate for slow drifts of the clock which may be due to, for example, thermal effects. These drifts are orders of magnitude slower than the frame rate. Notwithstanding this, the system will correct even for large drifts, but it will take an appreciable amount of time for any large drift to settle out. In the meantime, there may be an unacceptable data error rate.

While the illustrative system uses an oversampling clock, which is divided down by frequency divider 26 to a sampling clock, it would be possible for the multi-phase clock 14 to generate a clock having the same nominal frequency as the data rate. In this case, frequency divider 26 would be dispensed with. Also in this case, it would be desirable to have a very high number of phases, N, so that small incremental changes could be made to the phase of the clock 12.

Figure 4:
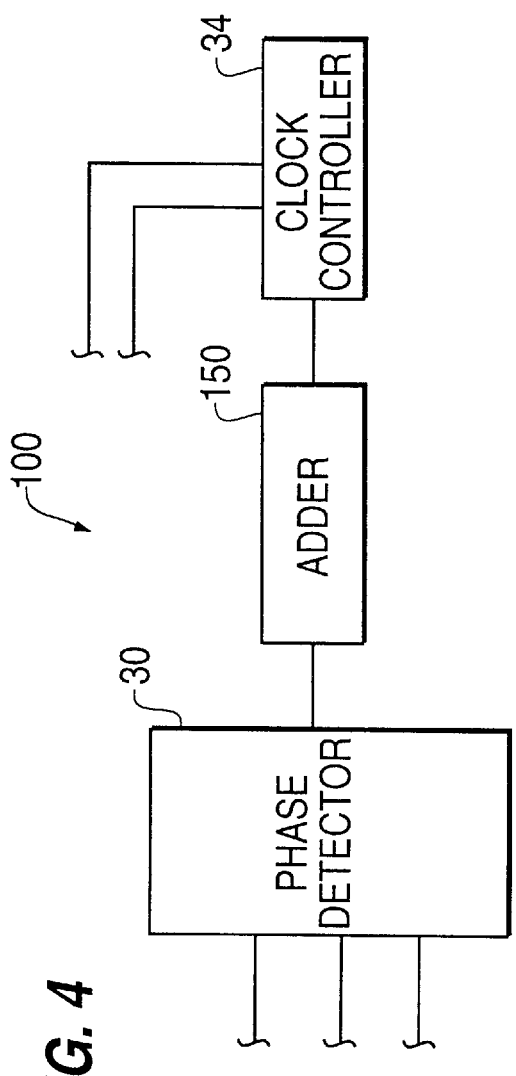
FIG. 4 is a schematic partial view of apparatus made in accordance with another aspect of this invention.

FIG. 4 illustrates another embodiment of the invention. Turning to FIG. 4, where like elements are given like reference numbers, apparatus 100 comprises an adder 150 interposed between phase detector 30 and clock controller 34. Adder 150 generates a running sum of the phase difference numbers output by phase detector 30. Thus, if the current sum is +4 and the output of the phase detector is updated so that the next difference sensed is −2, then the running sum becomes +2. This running sum is output to the clock controller. With the interposition of adder 150, the system will aggressively correct for any progressively increasing phase error. Furthermore, since the clock controller will adjust the phase in a sense which will always try to reduce this running sum, whenever the running sum reaches zero, the average phase error will also be zero.

A running sum filter acts as a perfect integrator (such that the transfer function takes the form $y=x+z^{-1}y$). In practical systems, a lossy integrator (having a transfer function taking the form $y=x+\alpha z^{-1}y$, with $\alpha$ slightly less than 1) may be preferred to enhance predictability of the system.

While in the illustrated embodiments one input to the phase detector 30 is the clock 12, which input is used so that the output of the phase detector is a phase error number representative of a number of clock pulses, optionally there may be no direct input to the phase detector from the clock. In such case the phase error number output from the phase detector may be representative simply of elapsed time.

Other modification will be apparent to those skilled in the art, and therefore, the invention is defined in the claims.

What is claimed is:

1. A method of sampling framed data in order to recover a data stream therefrom, where periodic data frames have a reference timing mark, comprising the steps of:

generating a clock signal having a nominal frequency which is an integer multiple of a data rate of said framed data and an integer multiple of a reference timing mark rate, said clock signal having a phase;

detecting cycles of said clock signal;

detecting said reference timing mark;

sensing a time difference between a time when said reference timing mark is detected and a time when a pre-set number of cycles of said clock signal is detected;

changing the phase of said clock signal based, at least in part, on said time difference to produce a phase changing clock signal; and sampling based on said phase changing clock signal.

2. The method of claim 1 wherein said step of changing the phase of said clock signal comprises changing the phase continually at a phase change rate.

3. The method of claim 2 wherein said phase change rate is set each time said time difference is sensed.

4. The method of claim 3 wherein said pre-set number comprises said integer multiple of said reference timing mark rate.

5. The method of claim 4 wherein the phase of said clock signal is changed to reduce said time difference.

6. The method of claim 5 wherein the step of changing the phase of said clock signal comprises changing said phase at said phase change rate dependent upon a magnitude of said time difference.

7. The method of claim 3 further including the step of generating a multiplicity of equal phase increments for said clock signal, said equal phase increments spanning 360 degrees and wherein said step of changing the phase of said clock signal comprises changing the phase of said clock signal by one of said equal phase increments each time said preset number of cycles of said clock signal are detected.

8. The method of claim 3 wherein said time difference sensed is summed with each said time difference previously sensed and wherein the step of changing the phase of said clock signal is based on said sum.

9. The method of claim 8 wherein the step of changing the phase of said clock signal comprises changing said phase at said phase change rate dependent on a magnitude of said sum.

10. The method of claim 1 wherein said clock signal is an oversampling clock and including the step of dividing said phase changing clock signal down to said data rate to produce a sampling clock.

11. The method of claim 1 wherein said integer multiple is greater than one.

12. A method of sampling framed data in order to recover data therefrom, where periodic data frames have a reference timing mark, comprising the steps of:

generating a clock signal having a nominal frequency which is an integer multiple of a data rate of said framed data and an integer multiple of a reference timing mark rate;

generating a multiplicity of phases for said clock signal;

detecting cycles of said clock signal;

detecting said reference timing mark;

sensing a time difference between a time when said reference timing mark is detected and a time when a number of clock cycles equivalent to said integer multiple of said reference timing mark rate is detected;

continually changing phases of said clock signal at a phase change rate based on a magnitude of said time difference to produce a phase changing clock signal; and sampling data based on said phase changing clock signal.

13. Apparatus for sampling framed data in order to recover a data stream therefrom, where periodic data frames have a reference timing mark, comprising:

a selectable phase clock signal generator for generating a clock signal having a nominal frequency which is an integer multiple of a data rate of said framed data and an integer multiple of a reference timing mark rate, said clock signal having a plurality of phases, said selectable phase clock signal generator outputting a selected phase of said clock signal, for use in sampling framed data;

a local timer responsive to said output from said selectable phase clock generator for detecting cycles of said selected phase of said clock signal and for generating a local timing mark whenever a pre-set number of clock signal cycles are detected;

a phase detector for responding to a source of framed data to detect said reference timing mark of said framed data and responsive to said local timing mark output from said local timer, said phase detector for outputting a signal indicating time difference between a time when said reference timing mark signal is detected and a time when said local timing mark is received from said local timer;

a clock signal controller responsive to output from said phase detector for controlling said selectable phase clock signal generator to select one of said plurality of phases of said clock signal.

14. The apparatus of claim 13, including a frequency divider connected to said selectable phase clock generator output for generating a sampling clock.

15. The apparatus of claim 13 including an adder responsive to output from said phase detector for summing indications of said time difference to provide a sum indication at an output, said clock controller being responsive to said output sum indication.

16. The apparatus of claim 13 wherein said selectable phase clock generator comprises a multi-phase clock generator and a phase selector.

17. The apparatus of claim 14 wherein said local timer is a frequency divider.

18. The apparatus of claim 13 including an integrator responsive to output from said phase detector for integrating indications of said time difference to provide an integration indication at an output, said clock controller being responsive to said output integration indication.

* * * * *